(12) United States Patent
Nagamatsu et al.

(10) Patent No.: US 7,576,629 B2  
(45) Date of Patent: Aug. 18, 2009

(54) SEMICONDUCTOR DEVICE HAVING SIGNAL LINE AND REFERENCE POTENTIAL PLANES SEPARATED BY A VERTICAL GAP

(75) Inventors: Tetsu Nagamatsu, Kawasaki (JP); Yuuichi Hotta, Yokohama (JP)

(73) Assignee: Kabushiki Kaisha Toshiba (JP)

( * ) Notice: Subject to any disclaimer, the term of this patent is extended or adjusted under 35 U.S.C. 154(b) by 288 days.

(21) Appl. No.: 11/297,042

(22) Filed: Dec. 7, 2005

(65) Prior Publication Data

US 2006/0146135 A1    Jul. 6, 2006

(30) Foreign Application Priority Data

Dec. 9, 2004   (JP) ............................ 2004-356735

(51) Int. Cl.  
*H01P 3/08*   (2006.01)

(52) U.S. Cl. ......................................... 333/247; 333/33

(58) Field of Classification Search ................. 333/238, 333/246, 33, 1, 247; 361/794  
See application file for complete search history.

(56) References Cited

U.S. PATENT DOCUMENTS

| | | | |
|---|---|---|---|
| 5,634,208 A | | 5/1997 | Nishikawa et al. |
| 5,852,391 A | * | 12/1998 | Watanabe et al. ............ 333/246 |
| 6,175,287 B1 | * | 1/2001 | Lampen et al. .............. 333/247 |
| 6,219,255 B1 | * | 4/2001 | Teshome ..................... 361/794 |
| 6,349,038 B1 | * | 2/2002 | Hailey ......................... 361/794 |
| 6,507,495 B1 | * | 1/2003 | Hailey et al. ................. 361/748 |
| 6,998,943 B2 | * | 2/2006 | Ohta et al. ................... 333/246 |
| 7,102,456 B2 | * | 9/2006 | Berg .............................. 333/4 |
| 7,102,463 B2 | * | 9/2006 | Clark .......................... 333/156 |
| 2005/0083147 A1 | * | 4/2005 | Barr .............................. 333/33 |

* cited by examiner

*Primary Examiner*—Benny Lee  
(74) *Attorney, Agent, or Firm*—DLA Piper LLP (US)

(57) ABSTRACT

A semiconductor device according to the one embodiment of the present invention comprises a signal line; and a reference potential plane which is separated from the signal line and opposed to the signal line, the reference potential plane being provided with a discontinuous region in a portion intersecting with the signal line, as a delay element to be added to the signal line.

6 Claims, 6 Drawing Sheets

SEMICONDUCTOR DEVICE HAVING SIGNAL LINE AND REFERENCE POTENTIAL PLANES SEPARATED BY A VERTICAL GAP

CROSS REFERENCE TO RELATED APPLICATION

This application is based upon and claims the benefit of priority from the prior Japanese Patent Application No. 2004-356735, filed on Dec. 9, 2004, the entire contents of which are incorporated herein by reference.

BACKGROUND OF THE INVENTION

1. Field of the Invention

The present invention relates to a semiconductor device supporting a signal line of a high speed input/output (I/O) such as GHz band and more particularly, to a disposition structure of a signal line formed on a wiring board constituting a semiconductor chip or package located in the vicinity of a reference potential plane such as a ground (GND) plane.

2. Related Background Art

In recent years, the number of specifications of high speed interfaces in which a high speed signal of some hundreds of MHz, the GHz band or 10 GHz passes through outside of a semiconductor chip such as a package, a board or the like-has increased. As the operation frequency becomes higher and rise time or fall time of the signal becomes shorter, it is necessary to design a pattern of a package which is conventionally handled as a lumped constant while taking, into consideration, impedance and transmission delay time as a transfer path.

Conventionally, the reference potential plane such as the ground (GND) plane disposed under such a high speed signal line is not usually provided with a large slit which causes impedance mismatch and blocks a feedback current path.

A large slit in view of electromagnetic interference (EMI) can not usually enter the GND plane provided directly below the transfer line on the board or package. Especially on the transfer line in which impedance is controlled, a reference GND plane is not provided with a notch. It is conventionally known that if the GND plane is provided with a slit, the speed of a propagating wave is reduced.

Japanese Patent Laid-Open Publication No. 2003-273620 described a portable electronic apparatus which comprises an antenna for sending and receiving radio wave, a circuit board which has the antenna and which is disposed in the longitudinal direction of the antenna, and a reactance component loading unit provided on the circuit board for securing a line length for an image current of one-quarter wavelength ($\lambda/4$) flowing through the ground of the circuit board in the longitudinal direction of the antenna, the reactance component loading unit comprises a slit. By providing the slit, a ground board length L4 can be adjusted such that it becomes a $\lambda/4$ line length, and the ground board length L4 is set such that the length L4 corresponds to an ideal ground board length L2. With this, it is possible to prevent the frequency of the antenna from deviating and to prevent the voltage standing wave ratio (VSWR) characteristics from deteriorating.

On the other hand, when the opposed reference potential plane exists in the vicinity of the signal line, a semiconductor device capable of generating signal transfer delay without providing a delay element on the side of the signal line and capable of easily forming an equivalent delay element on a wiring board constituting the semiconductor chip or package is required.

SUMMARY OF THE INVENTION

According to an one embodiment of the present invention, there is provided a semiconductor device comprising a signal line; and a reference potential plane which is separated from the signal line and opposed to the signal line, the reference potential plane being provided with a discontinuous region in a portion intersecting with the signal line, as a delay element to be added to the signal line.

DETAILED DESCRIPTION OF THE PREFERRED EMBODIMENTS

In each of embodiments of the present invention, a gap (discontinuous region) having an appropriate size is formed in a reference potential plane located in the vicinity of a signal line, thereby forming a slit in the reference potential plane without providing a delay element on the side of the signal line to generate a signal transmission delay, and an equivalent delay element is easily formed.

Embodiments of the present invention will be explained with reference to illustrated concrete example.

First Embodiment

The first embodiment will be explained with reference to FIGS. 1 to 4 and 8.

Figure 1:
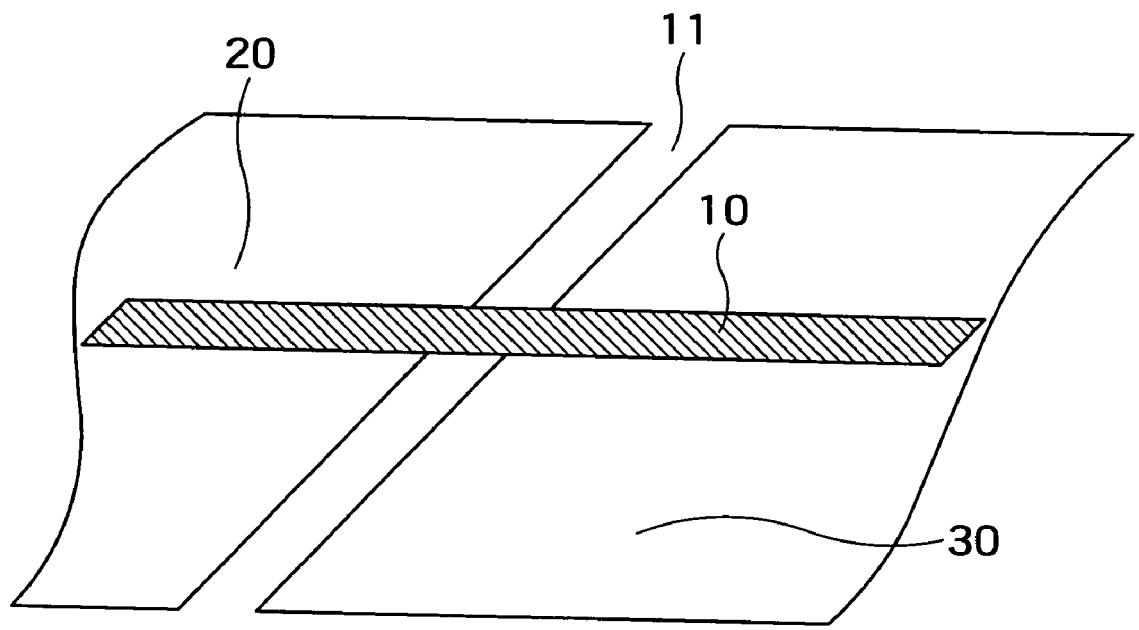
FIG. 1 is a perspective view showing disposition of a wiring pattern and a reference potential plane such as a GND plane or the like provided on a semiconductor chip or a wiring board in a semiconductor device of a first embodiment which is one embodiment of the present invention.
Figure 2:
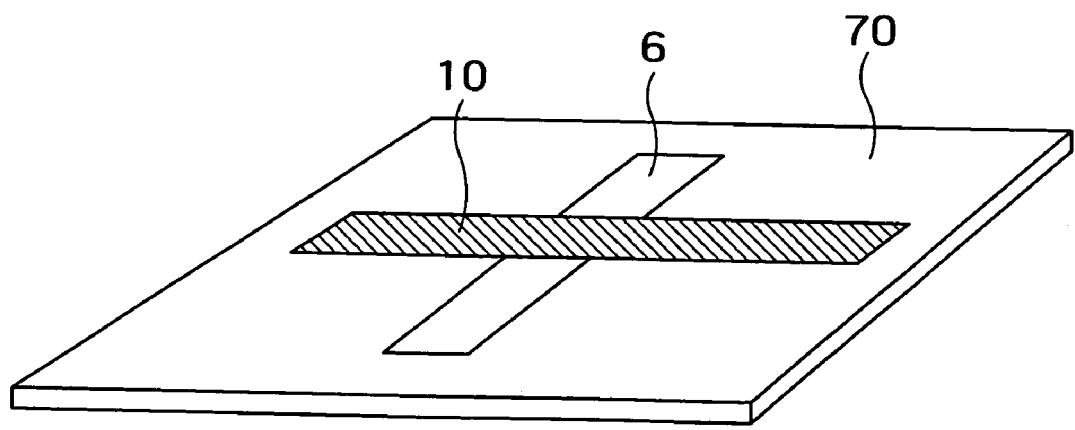
FIG. 2 is a perspective view showing disposition of a wiring pattern and a reference potential plane such as a GND plane or the like provided on a semiconductor chip or a wiring board in a semiconductor device of a first embodiment which is one embodiment of the present invention.
Figure 3A:
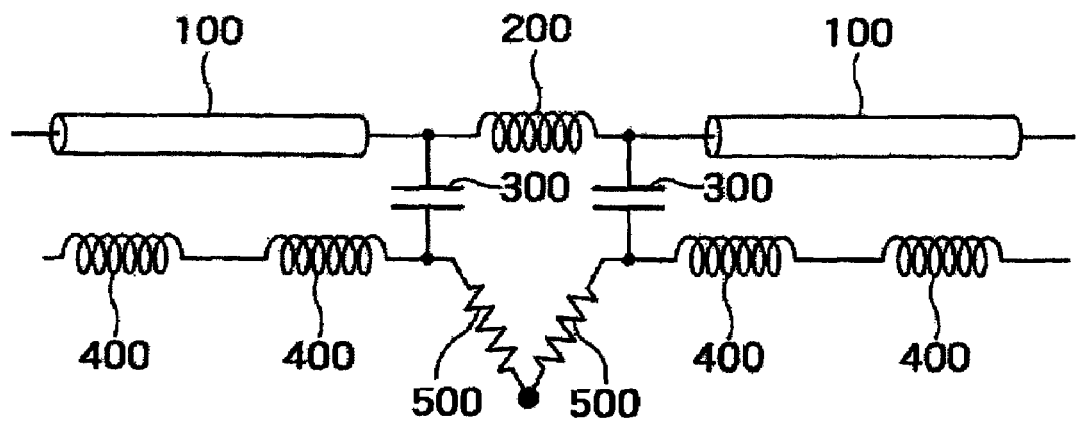
FIGS. 3A and 3B are equivalent circuit diagrams which show generation of signal transfer delays of a gap or a slit formed in a reference potential plane in FIG. 2 or 3.
Figure 3B:
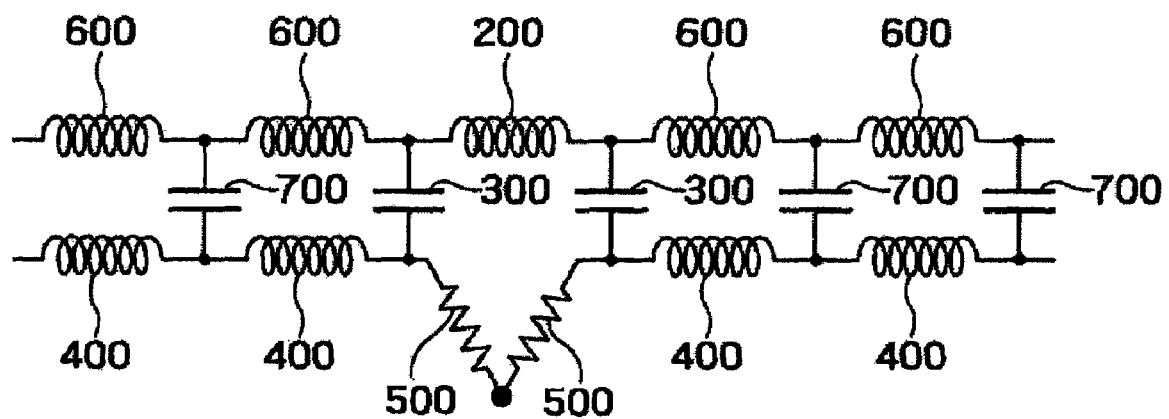
Figure 4A:
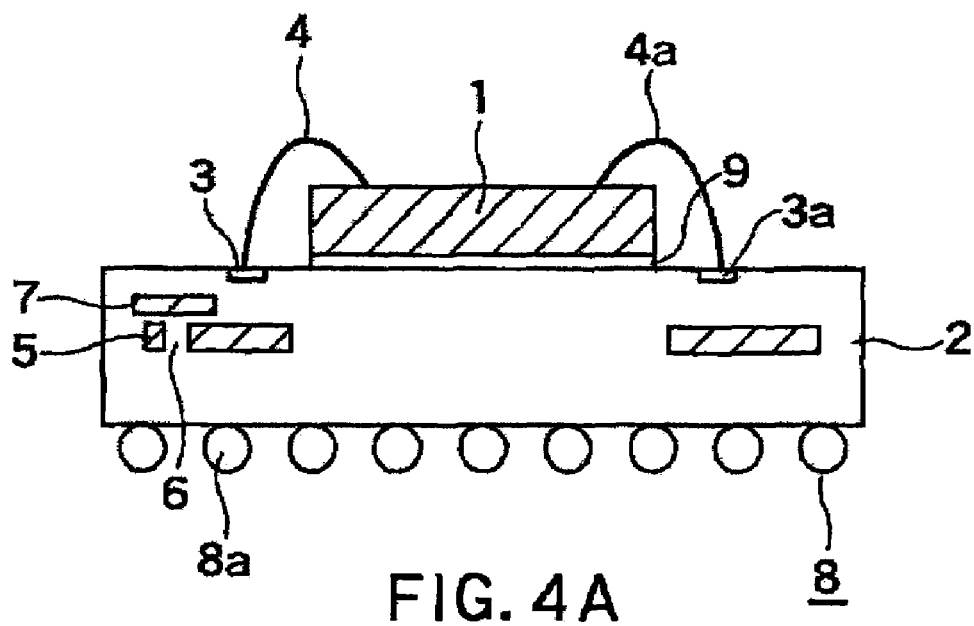
FIG. 4A is a sectional view of a semiconductor device formed with a signal line and a reference potential plane used for explaining the first embodiment and FIG. 4B is a partially perspective plan view of an interior of the semiconductor device formed with the signal line and the reference potential plane used for explaining the first embodiment.
Figure 4B:
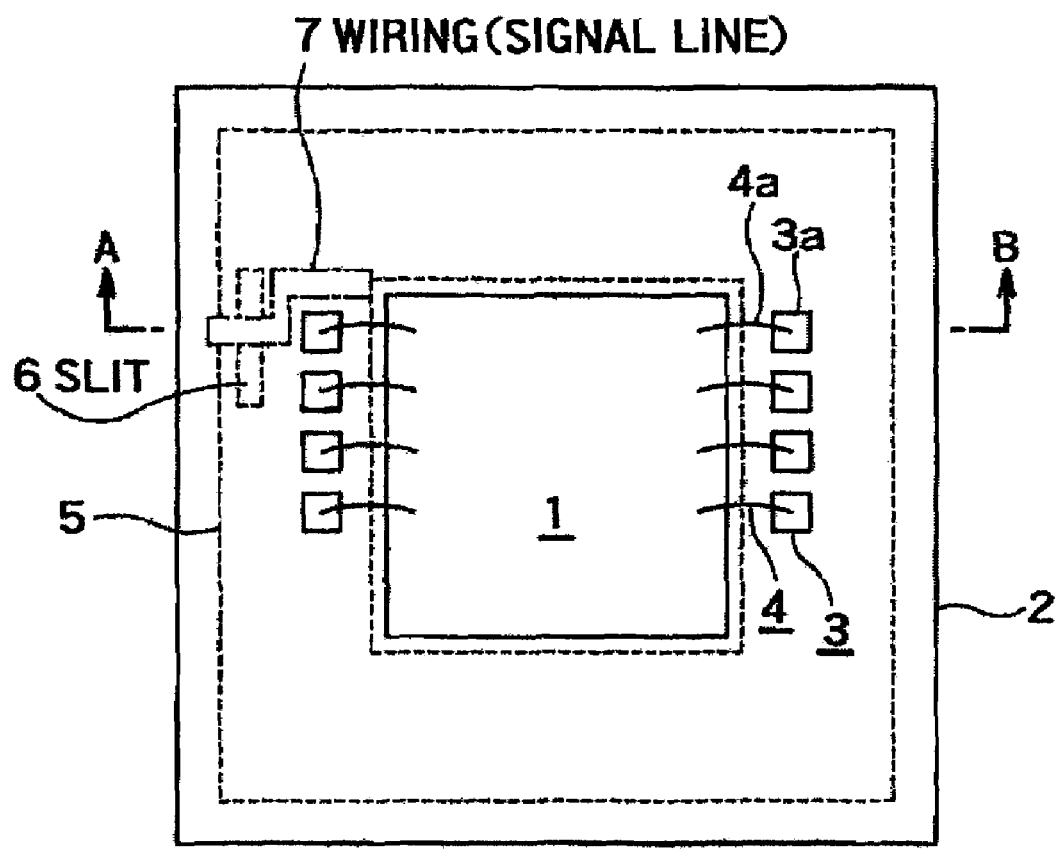
Figure 8A:
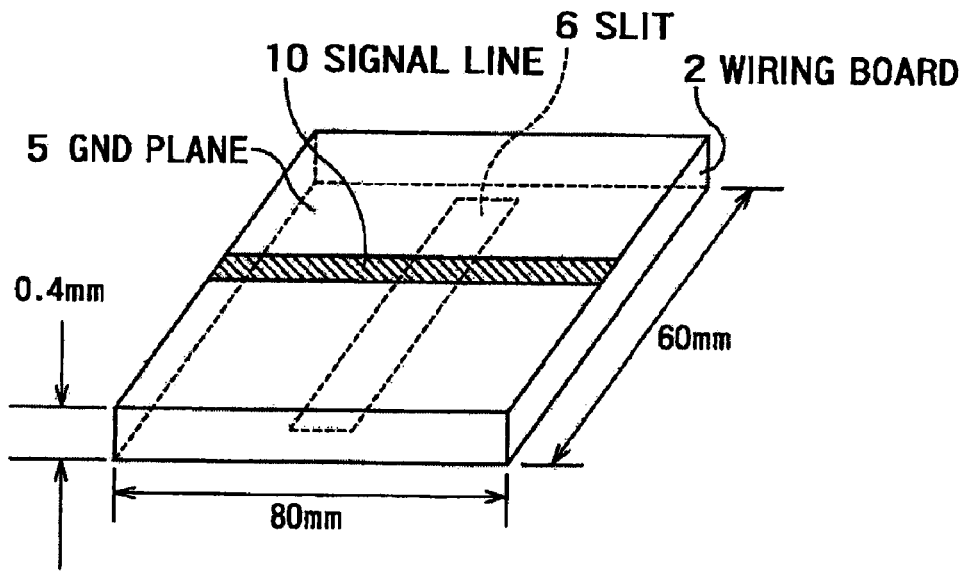
FIGS. 8A and 8B are a perspective view of a wiring board and a diagram showing characteristics used for explaining the delay effect of a slit formed in a reference potential plane in a first embodiment.
Figure 8B:
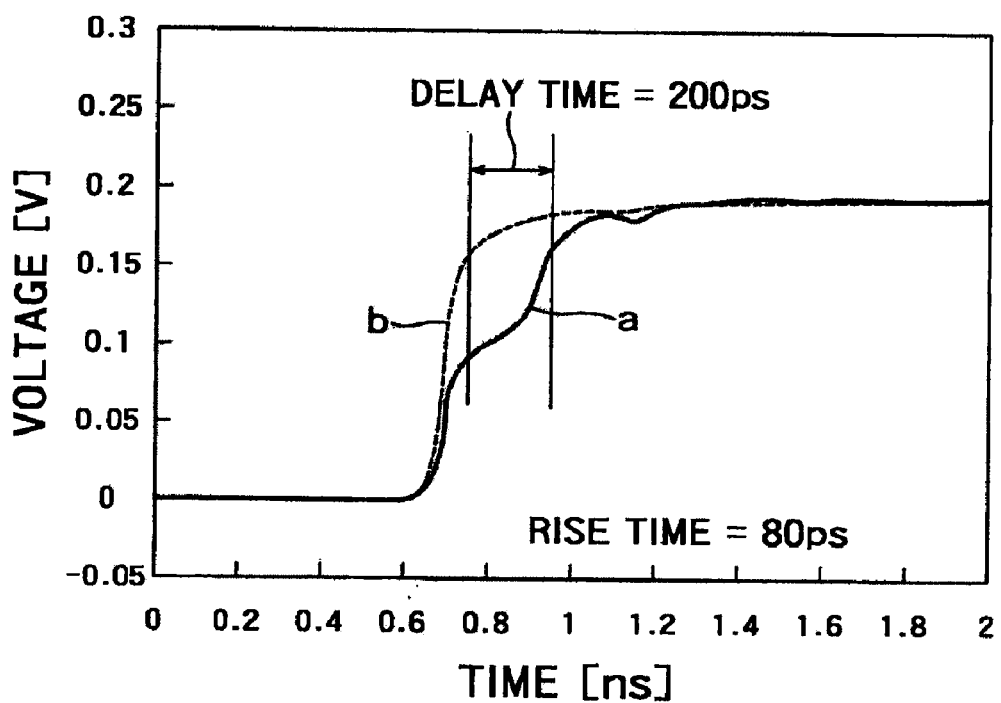

FIGS. 1 and 2 are perspective views showing disposition of a wiring pattern and a reference potential plane such as a ground (GND) plane or the like provided on a semiconductor chip or a wiring board in a semiconductor device of the first embodiment of the present invention. FIGS. 3A and 3B are equivalent circuit diagrams which show generation of signal transfer delays of a gap or a slit formed in a reference potential plane. FIG. 4A is a sectional view of a semiconductor device formed with a signal line and a reference potential plane used for explaining the first embodiment. FIG. 4B is a partially perspective plan view of an interior of the semiconductor device formed with the signal line and the reference potential plane used for explaining the first embodiment. FIGS. 8A and 8B are a perspective view of a wiring board and a diagram showing characteristics used for explaining the delay effect of a slit formed in a reference potential plane. A sectional view taken along the line A-B in FIG. 4B corresponds to FIG. 4A.

In FIG. 1, a semiconductor chip constituting a semiconductor device, a wiring board constituting the semiconductor device, or wiring pattern and reference potential plane such as GND plane (in this embodiment, this is explained using a ground (GND) plane) provided on a mounting board on which the semiconductor device is mounted are disposed. The GND plane comprises a first GND plane 20 and a second GND plane 30 in the same plane, and a gap 11 is provided between the first and second GND planes 20 and 30. A signal line 10 is disposed above the GND planes 20 and 30 such as to cross at least the gap 11 in the vicinity of the GND planes 20 and 30.

In FIG. 2, a semiconductor chip constituting the semiconductor device, the wiring board constituting the semiconductor device, or wiring pattern and GND plane 70 provided on the mounting board on which the semiconductor device is mounted are disposed. The GND plane 70 is formed with a slit 6 within the GND plane 70. A signal line 10 is disposed above the GND plane 70 such as to cross at least the slit 6 in the vicinity of the GND plane 70. The GND planes 20 and 30 are completely separated from each other with the gap 11 interposed therebetween (such as shown in FIG. 1), and a feedback current path is completely cut off. On the other hand, as shown in FIG. 2, the slit 6 formed in the GND plane 70 is not in the separated state unlike the GND planes 20 and 30 and is in a state where both ends are connected to each other.

The discontinuous region such as the gap or slit is formed on the GND plane located in the vicinity of the signal line. With this, a signal transmission delay can be generated on the side of the GND plane without providing a delay element on the side of the signal line, and an equivalent delay element can easily be formed.

If a case where the GND plane is separated by the gap and a case where both ends are connected as shown in FIG. 2 are compared with each other, a value of the delay amount and variation in delay amount caused by the shape of the slit are added, and the delay amount when both ends are not connected is greater than that when both ends are connected, and variation in delay amount caused by variation in slit width (gap width) is great.

In this manner, the delay amount can be adjusted by the shape, and it is possible to form a delay element having a desired signal delay amount by a pattern of the GND plane of the package.

Next, with reference to FIGS. 4A and 4B, the signal line provided on the wiring board constituting the semiconductor device and a delay element formed by the GND plane will be explained.

The semiconductor device shown in FIGS. 4A and 4B includes a semiconductor chip 1 and a wiring board 2 having multi-wiring layers on which the semiconductor chip 1 is mounted. The semiconductor chip 1 formed with the semiconductor device is connected to the wiring board 2 with adhesive 9 as shown in FIG. 4A. Connection electrodes 3 and 3a which are wiring patterns exposed to the surface of the wiring board 2 are formed on the surface of the wiring board 2. The semiconductor chip 1 and the connection electrodes 3 and 3a are electrically connected to each other through a bonding wire 4 bonded to the connection electrode (not shown) on the surface of the semiconductor chip 1. Wiring patterns including a signal line 7 and a GND plane 5 are formed in a multi-layered manner in the wiring board 2. As shown in FIG. 4A, external connection terminals 8 and 8a such as soldering balls or the like are formed on the back surface of the wiring board 2 through a connection electrode (not shown).

External connection terminals 8 and 8a are electrically connected to a semiconductor device formed in the semiconductor chip 1 through a wiring pattern in the wiring board 2. For example, the GND terminal 8a is connected to the semiconductor device of the semiconductor chip 1 through the connection electrode 3a on the surface of the wiring board 2 and the bonding wire 4a connected to the connection electrode 3a via a GND plane 5 formed in the wiring board 2. The external connection terminal 8 is connected to the semiconductor device of the semiconductor chip 1 through the connection electrode 3 on the surface of the wiring board 2 and the bonding wire 4 connected to the connection electrode 3 via the signal line 7 constituting the wiring pattern in the wiring board 2.

The GND plane 5 is formed into a toroidal shape over the entire region of the wiring board 2 except a region directly below the semiconductor chip 1, and the slit 6 is formed in a portion of the GND plane 5. The signal line 7 is closely opposed to the GND plane 5 such that at least a portion of the signal line 7 crosses the slit 6. By forming the slit (discontinuous region) having an appropriate size in the GND plane located close to the signal line 7, it is possible to generate a signal transmission delay on the side of the GND plane and to easily add an equivalent delay element to the signal line without providing the delay element itself on the side of the signal line. The semiconductor device of this embodiment is designed for transmitting short-wavelength signals, especially high speed signals within the range of the GHz band, the THz band or higher frequency bands.

FIGS. 3A and 3B are equivalent circuits explaining the electric property of the structure shown in FIG. 1 or FIG. 2. In FIG. 3A a transmission line 100 represents the signal line 10 shown in FIG. 1 or FIG. 2. In FIG. 3B a LC circuit constituted by a coil 600 and a capacitor 700 represents the signal line 10 shown in FIG. 1 or FIG. 2. In FIGS. 3A and 3B a coil 400 represents the inductance of a reference potential plane (20, 30, 70) below the signal line 10. Resistors 500 represent that the reference potential plane is isolated by a high resistance at the gap 11 or slit 6. A coil 200 and capacitors 300 depicted in FIGS. 3A and 3B represent that the impedance of the signal line 10 in FIG. 1 or FIG. 2 varies due to the gap 11 or slit 6. The delay amount of the equivalent delay circuit can easily be adjusted by the shape of the slit, such as the width of the slit, and it is possible to form a delay element having a desired signal delay amount by a pattern of the GND plane.

FIGS. 8A and 8B are a perspective view of a wiring board and a diagram showing characteristics used for explaining the delay effect of a slit 6 formed in the GND plane 5 in the board 2 having the signal line 10 disposed in the vicinity of the GND plane 5 formed with the reference potential plane (GND plane). The wiring board shown in FIG. 8A is the GND plane 5 formed at its one surface with the slit 6, and formed at its other surface with the signal line 10. The wiring board has a vertical length of 60 mm, a lateral length of 80 mm and a thickness of 0.4 mm. As shown in FIG. 8B, the voltage (V) of a signal on the signal line is shown as a function to time (ns). If a signal rises in the signal line, when the rise time is 80 ps, a delay of 200 ps is generated. A dotted curved line b shows a waveform of a signal flowing through the signal line when there is no slit. A solid curved line a shows a waveform of a signal flowing through the signal line when there is a slit as shown in FIG. 8A. The delay effect of the slit formed in the GND plane is sufficient for using like this as a delay element.

Second Embodiment

The second embodiment will be explained with reference to FIGS. 5A and 5B.

Figure 5A:
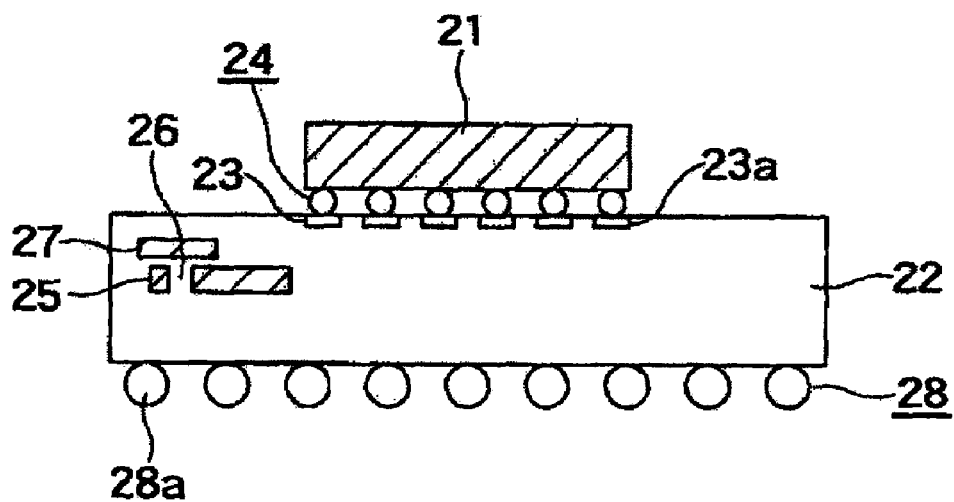
FIG. 5A is a sectional view of a semiconductor device formed with a signal line and a reference potential plane for explaining a second embodiment which is one embodiment of the present invention.
Figure 5B:
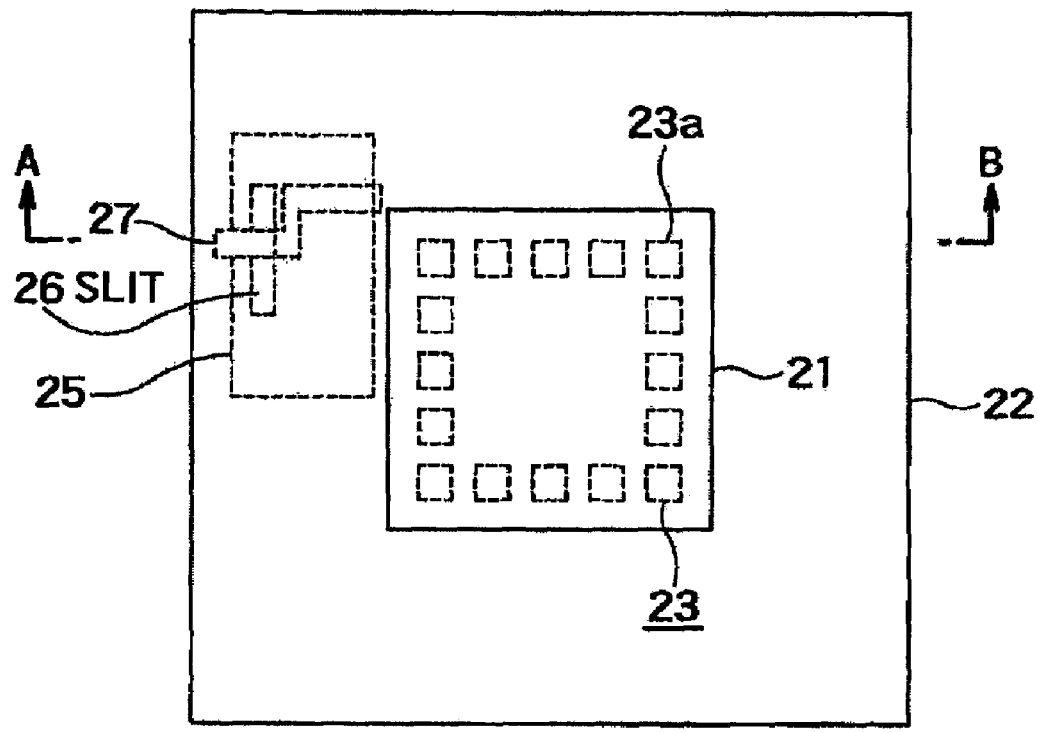
FIG. 5B is a partial perspective plan view of the semiconductor device formed with the signal line and the reference potential plane for explaining the second embodiment which is one embodiment of the present invention.

FIG. 5A is a sectional view of a semiconductor device formed with a signal line and a reference potential plane for explaining the second embodiment of the present invention, and FIG. 5B is a partial perspective plan view of the semiconductor device formed with the signal line and the reference potential plane for explaining the second embodiment of the present invention. A sectional view taken along the A-B line in FIG. 5B corresponds to FIG. 5A. Unlike the first embodiment, the second embodiment is characterized in that the GND plane is partially disposed on the wiring board, and the semiconductor chip is connected to the wiring board in a flip chip manner.

The semiconductor device shown in FIGS. 5A and 5B includes a semiconductor chip 21 and a wiring board 22 having multi-layered wiring layers on which the semiconductor chip 21 is mounted. The semiconductor chip 21 is formed with the semiconductor device. The semiconductor chip 21 is connected to the wiring board 22 through soldering balls (connecting terminals) 24 in a flip chip manner as shown in FIG. 5A. Connection electrodes 23 and 23a which wiring patterns are formed on the surface of the wiring board 22 such as to be exposed from the surface. The semiconductor chip 21 and the connection electrodes 23 and 23a are electrically connected to each other through the connection electrodes (not shown) on the surface of the semiconductor chip 21 and the soldering balls 24 connected to the connection electrodes 23 and 23a on the wiring board 22. Wiring patterns including the signal line 27 and the GND plane 25 are formed in the wiring board 22 in the multi-layered manner.

As shown in FIG. 5A, the external connection terminals 28 and 28a such as soldering balls are formed on the back surface of the wiring board 22 via connection electrodes (not shown). The external connection terminals 28 and 28a are electrically connected to the semiconductor device formed on the semiconductor chip 21 through the wiring pattern in the wiring board 22. For example, the GND terminal 28a is connected to the semiconductor device of the semiconductor chip 21 through the connection electrode 23a on the surface of the wiring board 22 and the soldering balls 24a connected to the connection electrode 23a via the GND plane 25 formed in the wiring board 22. The external connection terminal 28 is connected to the semiconductor device of the semiconductor chip 21 through the connection electrode 23 on the surface of the wiring board 22 and the soldering balls 24 connected to the connection electrode 23 via the signal line 27 which constitutes the wiring pattern in the wiring board 22.

Here, the GND plane 25 is formed on a portion of the wiring board 22 separated from a region directly below the semiconductor chip 21. The GND plane 25 is formed at its portion with the slit 26. The signal line 27 is closely opposed to the GND plane 25 such that at least a portion of the signal line 27 crosses the slit 26. By forming the slit (discontinuous region) having appropriate size in the GND plane located close to the signal line 27, it is possible to generate a signal transmission delay on the side of the GND plane and to easily add an equivalent delay element to the signal line without providing the delay element itself on the side of the signal line as explained with reference to FIGS. 8A and 8B. The semiconductor device of this embodiment is designed for transmitting short-wavelength signals, especially high speed signals within the range of the GHz band, the THz band or higher frequency bands.

FIG. 3B shows the equivalent circuit of the delay element formed by the slit 26. Its delay amount can easily be adjusted by the shape of the slit such as the width of the slit, and it is possible to form a delay element having a desired signal delay amount by a pattern of the GND plane.

Third Embodiment

The third embodiment will be explained with reference to FIGS. 6 and 7.

Figure 6:
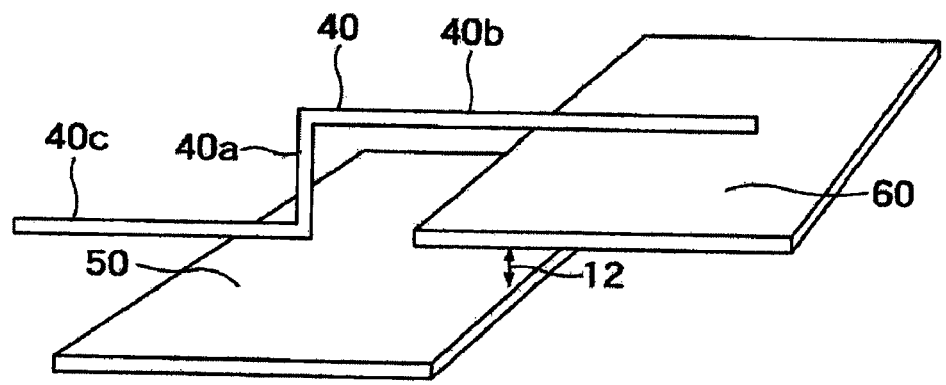
FIG. 6 is a perspective view showing disposition of a wiring pattern and a reference potential plane such as a GND plane or the like provided on a semiconductor chip or a wiring board in a semiconductor device of a third embodiment which is one embodiment of the present invention.
Figure 7:
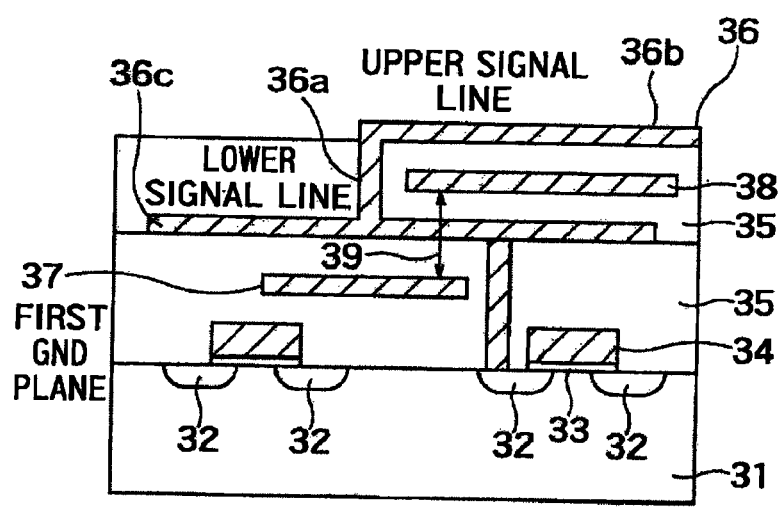
FIG. 7 is a sectional view of a semiconductor chip having a multi-layer wiring layer formed with a reference potential plane of the third embodiment.

FIG. 6 is a perspective view showing disposition of a wiring pattern and a reference potential plane such as a GND plane or the like provided on a semiconductor chip or a wiring board in a semiconductor device of the third embodiment of the present invention. FIG. 7 is a sectional view of a semiconductor chip having a multi-layer wiring layer formed with a reference potential plane of the third embodiment of the present invention.

Unlike the first and second embodiments, the third embodiment is characterized in that two GND planes are formed in different layers of wiring layers so that an interlayer space between the layers functions as a gap forming the discontinuous region, and wiring layers formed on the semiconductor chip are formed with a GND plane having a discontinuous region and a signal line for a high speed signal and the like.

In FIG. 6, a wiring pattern including a signal line and a reference potential plane such as the GND plane provided on a semiconductor chip constituting a semiconductor device, a wiring board constituting a semiconductor device or a mounting board on which a semiconductor device is mounted are disposed. The GND plane comprises first and second GND planes 50 and 60 formed on different layers which are upper and lower layers. A gap 12 exists in the interlayer space between the first and second GND planes 50 and 60. A signal line 40 is disposed above the GND planes 50 and 60 in the vicinity of thereof. The signal line 40 extends between the layers. The signal line 40 comprises an upper signal line 40b, a lower signal line 40c and a vertical signal line 40a formed in a via connecting the signal lines 40b and 40c with each other. The vertical signal line 40a is formed in the vicinity of the gap 12 formed in the interlayer space between the first and second GND planes 50 and 60.

By forming the discontinuous region such as the gap on the GND plane located in the vicinity of the signal line, it is possible to generate a signal transmission delay on the side of the GND plane even if the delay element is not provided on the side of the signal line, and to easily add an equivalent delay element to the signal line. Since the delay amount can be varied by varying the shape such as a gap width, it is possible to form a delay element having a desired signal delay amount on the signal line.

Next, a case in which a delay element formed of the signal line and the GND plane of the third embodiment is formed on a semiconductor chip will be explained with reference to FIG. 7. A structure having the delay element (see FIG. 6) may be incorporated in the wiring pattern of the wiring board constituting the semiconductor device.

A semiconductor substrate 31 constituting the semiconductor chip is formed with a transistor constituting an integrated circuit. On the surface of the semiconductor substrate 31, a wiring pattern 36 which is electrically connected to the integrated circuit is formed in an insulation film 35. The transistor is a MOS transistor for example, and includes a source/drain region 32, a gate insulating film 33 formed on the source/drain region 32 and a gate electrode 34 formed on the gate insulating film 33. The semiconductor substrate 31 is provided at its surface with an insulating film 35 such as a silicon oxide film, and a wiring pattern 36 made of multi-layered aluminum and the like is formed in the insulating film 35. Further, the GND plane made of aluminum and the like is formed in the insulating film 35.

As the GND planes, a first GND plane 37 is formed as a lower layer, a second GND plane 38 is formed as an upper layer, and an interlayer gap 39 is formed therebetween. The wiring pattern 36 is formed with a signal line above and along the GND plane. The signal line comprises a lower signal line 36c, an upper signal line 36b and a vertical signal line 36a disposed therebetween and formed in the via of the insulation film 35. The first GND plane 37 is opposed to the lower signal line 36c closely, the second GND plane 38 is opposed to the upper signal line 36b closely, and the interlayer gap 39 between the layers of the GND planes is opposed to the signal line 36a closely.

In this manner, the discontinuous region is formed by the interlayer gap between the GND planes 37 and 38 located closer to the signal lines 36a, 36b and 36c. With this, it is possible to generate a signal transmission delay on the side of the GND plane even if the delay element is not provided on the side of the signal line, and to easily add an equivalent delay element to the signal line (see FIG. 8B). Since the delay amount can be varied by varying the shape such as a gap width, it is possible to form a delay element having a desired signal delay amount on the signal line. The semiconductor device of this embodiment is designed for transmitting short-wavelength signals, especially high speed signals within the range of the GHz band, the THz band or higher frequency bands.

In the above embodiment, the signal line for a high speed signal and the like of the wiring pattern provided on the semiconductor chip or wiring board constituting the semiconductor device, and the GND plane opposed to the signal line closely are explained, but an equivalent delay element is formed also between the signal line for the high speed signal and the like of the wiring pattern provided on the board on which the semiconductor device is mounted and the GND plane opposed to the signal line closely, and the present invention is also applied to the latter case also of course.

As explained above, according to the embodiments of the present invention, by forming the gap (discontinuous region) having an appropriate size on the reference potential plane located in the vicinity of the wiring pattern formed on the semiconductor chip or package board constituting the semiconductor device, it is possible to easily add an equivalent delay element having desired characteristics by adding the shape on the side of the reference potential plane rather than on the side of the signal line of the wiring pattern.

What is claimed is:

1. A semiconductor device comprising:
    a signal line;
    a reference potential plane which is separated from the signal line and opposed to the signal line, the reference potential plane being provided with a discontinuous region in a portion intersecting with the signal line, as a delay element to be added to the signal line, and
    a semiconductor chip, wherein the signal line and the reference potential plane are electrically connected to the semiconductor chip,
    wherein one side and the other side of the reference potential plane with respect to the discontinuous region are electrically separated from each other through the discontinuous region,
    wherein the reference potential plane comprises a first reference potential plane and a second reference potential plane which is disposed above the first reference potential plane and separated from the first reference potential plane, the discontinuous region comprises a gap between the first and second reference potential planes.

2. The semiconductor device according to claim 1, wherein the reference potential plane is a ground (GND) potential plane.

3. A semiconductor device comprising:
    a signal line;
    a reference potential plane which is separated from the signal line and opposed to the signal line, the reference potential plane being provided with a discontinuous region in a portion intersecting with the signal line, as a delay element to be added to the signal line;
    a semiconductor chip, wherein the signal line and the reference potential plane are electrically connected to the semiconductor chip; and
    a wiring board on which the semiconductor chip is mounted, wherein the signal line and the reference potential plane are disposed on the wiring board,
    wherein the reference potential plane comprises a first reference potential plane and a second reference potential plane which is disposed above the first reference potential plane and separated from the first reference potential plane, the discontinuous region comprises a gap between the first and second reference potential planes.

4. The semiconductor device according to claim 3, wherein the reference potential plane is a ground (GND) potential plane.

5. A semiconductor device comprising:
    a signal line; and
    a reference potential plane which is separated from the signal line and opposed to the signal line, the reference potential plane being provided with a discontinuous region in a portion intersecting with the signal line, as a delay element to be added to the signal line,
    a semiconductor chip, wherein the signal line is disposed on a surface of the semiconductor chip and provided in a wiring pattern which is electrically connected to an internal circuit in the semiconductor chip, and the reference potential plane is disposed on a surface of the semiconductor chip and is electrically connected to the semiconductor chip, wherein one side and the other side of the reference potential plane with respect to the discontinuous region are electrically separated from each other through the discontinuous region, wherein the reference potential plane comprises a first reference potential plane and a second reference potential plane which is disposed above the first reference potential plane and separated from the first reference potential plane, the discontinuous region comprises a gap between the first and second reference potential planes.

6. The semiconductor device according to claim 5, wherein the reference potential plane is a ground (GND) potential plane.

* * * * *